US009765239B2

(12) United States Patent
Lan et al.

(10) Patent No.: US 9,765,239 B2
(45) Date of Patent: Sep. 19, 2017

(54) USE OF A CHEMICAL-MECHANICAL POLISHING (CMP) COMPOSITION FOR POLISHING A SUBSTRATE OR LAYER CONTAINING AT LEAST ONE III-V MATERIAL

(71) Applicant: BASF SE, Ludwigshafen (DE)

(72) Inventors: Yongqing Lan, Ludwigshafen (DE); Peter Przybylski, Ludwigshafen (DE); Zhenyu Bao, Potsdam, NY (US); Julian Proelss, Worms (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/890,754

(22) PCT Filed: May 6, 2014

(86) PCT No.: PCT/IB2014/061234
§ 371 (c)(1),
(2) Date: Nov. 12, 2015

(87) PCT Pub. No.: WO2014/184708
PCT Pub. Date: Nov. 20, 2014

(65) Prior Publication Data

US 2016/0096979 A1 Apr. 7, 2016

(30) Foreign Application Priority Data

May 15, 2013 (EP) .................................... 13167941

(51) Int. Cl.

| | |
|---|---|
| ***C09G 1/02*** | (2006.01) |
| ***B24B 37/04*** | (2012.01) |
| ***C09K 3/14*** | (2006.01) |
| ***H01L 21/306*** | (2006.01) |
| ***H01L 21/02*** | (2006.01) |

(52) U.S. Cl.
CPC .............. *C09G 1/02* (2013.01); *B24B 37/044* (2013.01); *C09K 3/1436* (2013.01); *C09K 3/1463* (2013.01); *H01L 21/02024* (2013.01); *H01L 21/30625* (2013.01)

(58) Field of Classification Search
None
See application file for complete search history.

(56) References Cited

U.S. PATENT DOCUMENTS 3,922,393 A * 11/1975 Sears, Jr. ................ H01L 21/00 257/E21.23
5,387,796 A * 2/1995 Joshi .................. H01L 31/0352 250/370.12
6,627,539 B1 * 9/2003 Zhao ................ H01L 21/76807 257/E21.579
7,022,255 B2 4/2006 Siddiqui et al.
7,507,668 B2 3/2009 Ishibashi et al.
8,778,211 B2 * 7/2014 Stender ................ C09K 3/1436 216/88
8,790,160 B2 * 7/2014 Lee .......................... C09G 1/02 257/E21.23
2007/0037892 A1 2/2007 Belov
2007/0049164 A1 * 3/2007 Thomson .............. B24B 37/245 451/5
2007/0169421 A1 * 7/2007 Koyama .................. C09G 1/02 51/298
2009/0159845 A1 6/2009 Ishibashi et al.
2010/0130013 A1 * 5/2010 Liu .......................... C09G 1/02 438/693
2013/0005219 A1 1/2013 Takemura et al.

FOREIGN PATENT DOCUMENTS

| | | |
|---|---|---|
| EP | 1 772 503 | 4/2007 |
| EP | 2 533 274 | 12/2012 |
| WO | 2004 063301 | 7/2004 |
| WO | 2006 028759 | 3/2006 |
| WO | 2010 134542 | 11/2010 |
| WO | 2011 093153 | 8/2011 |

OTHER PUBLICATIONS

International Search Report Issued Mar. 4, 2015 in PCT/IB14/061234 Filed May 6, 2014.

* cited by examiner

*Primary Examiner* — Allan Olsen
(74) *Attorney, Agent, or Firm* — Oblon, McClelland, Maier & Neustadt, L.L.P.

(57) ABSTRACT

Described is a use of a chemical-mechanical polishing (CMP) composition for polishing a substrate or layer containing one or more III-V materials, wherein the chemical-mechanical polishing (CMP) composition comprises the following components: (A) surface modified silica particles having a negative zeta potential of −15 mV or below at a pH in the range of from 2 to 6 (B) one or more constituents selected from the group consisting of (i) substituted and unsubstituted triazoles not having an aromatic ring annealed to the triazol ring, (ii) benzimidazole, (iii) chelating agents selected from the group consisting of amino acids with two or more carboxyl groups, aliphatic carboxylic acids, and the respective salts thereof, and (iv) homopolymers and copolymers of acrylic acid, and the respective salts thereof, (C) water (D) optionally one or more further constituents, wherein the pH of the composition is in the range of from 2 to 6.

13 Claims, No Drawings

USE OF A CHEMICAL-MECHANICAL POLISHING (CMP) COMPOSITION FOR POLISHING A SUBSTRATE OR LAYER CONTAINING AT LEAST ONE III-V MATERIAL

FIELD OF THE INVENTION

The present invention relates to the use of a chemical-mechanical polishing composition comprising surface modified silica particles having a negative zeta potential of −15 mV or below at a pH in the range of from 2 to 6 and one or more additives (B) as defined hereinbelow. The present invention also relates to a process for the manufacture of semiconductor devices comprising the chemical-mechanical polishing of a substrate or layer in the presence of said chemical-mechanical polishing (CMP) composition.

DESCRIPTION OF THE PRIOR ART

In the semiconductor industry, chemical mechanical polishing is a well-known technology applied in fabricating advanced photonic, microelectromechanical and microelectronic materials and devices, such as semiconductor wafers.

During the fabrication of materials and devices used in the semiconductor industry, CMP is employed to planarize surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

In the state of the art, CMP processes in the presence of a CMP composition comprising surface modified silica particles are known and described, for instance, in the following references.

WO 2006/028759 A2 describes an aqueous slurry composition for polishing/planarization substrates which are utilized in the process of metal interconnect formation on IC devices. Said slurry comprising silicon dioxide abrasive particles wherein said abrasive particles are anionically modified/doped with metallate anions selected from the group consisting of aluminate, stannate, zincate and plumbate, thereby providing a high negative surface charge to said abrasive particles and enhancing the stability of said slurry composition.

EP 2 533 274 A1 discloses a chemical mechanical polishing aqueous dispersion comprising (A) silica particles that include at least one functional group selected from a group consisting of a sulfo group and salts thereof, and (B) an acidic compound.

OBJECTS OF THE INVENTION

One of the objects of the present invention is to provide a use of a CMP composition and a CMP process especially for the chemical-mechanical polishing of III-V materials, particularly GaAs and InP substrates which are utilized in the front-end-of-line (FEOL) IC production to form transistors, in particular nMOS transistors, and showing an improved polishing performance, especially (i) a high material removal rate (M RR) of a III-V material, for example GaAs and/or InP, (ii) an adjustable selectivity between different III-V materials (i.e. a high ratio between the material removal rates of said different III-V materials), e.g. a high selectivity of GaAs over InP, (iii) high surface quality of the III-V material, for example GaAs and/or InP, after the CMP step, (iv) safe handling and reduction of hazardous by-products—for example the toxic gasses $AsH_3$ and/or $PH_3$ in case of polishing GaAs and/or InP—to a minimum, or (v) or the combination of (i), (ii), (iii) and (iv).

In particular said use was sought to enable the integration of III-V materials into high mobility devices with performance below 16 nm.

Moreover, a CMP process was sought that is easy to apply and requires as few steps as possible.

SUMMARY OF THE INVENTION

A first aspect of the present invention relates to the use of a chemical-mechanical polishing (CMP) composition for polishing a substrate or layer containing one or more III-V materials, wherein the chemical-mechanical polishing (CMP) composition comprises the following components:

(A) surface modified silica particles having a negative zeta potential of −15 mV or below at a pH in the range of from 2 to 6

(B) one or more constituents selected from the group consisting of (i) substituted and unsubstituted triazoles not having an aromatic ring annealed to the triazol ring, (ii) benzimidazole, (iii) chelating agents selected from the group consisting of amino acids with two or more carboxyl groups, aliphatic carboxylic acids, and the respective salts thereof, and (iv) homopolymers and copolymers of acrylic acid, and the respective salts thereof, (C) water (D) optionally one or more further constituents, wherein the pH of the composition is in the range of from 2 to 6.

Preferably, the one, at least one or all III-V materials are selected from the group consisting of GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, and GaInAsSb.

According to a further aspect of the invention there is provided a process for the manufacture of semiconductor devices comprising the chemical-mechanical polishing of a substrate or layer containing one or more III-V materials in the presence of a chemical-mechanical polishing (CMP) composition as defined hereinabove or hereinbelow. Preferably, the one, at least one or all III-V materials are selected from the group consisting of GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, and GaInAsSb.

Semiconductor devices which can be manufactured by the process of the invention can be those which are manufactured as single discrete devices or those which are manufactured as integrated circuits (ICs) consisting of a number of devices manufactured and interconnected on a wafer.

Semiconductor devices can be two terminal devices for example a diode, three terminal devices for example a bipolar transistor, four terminal devices for example a Hall effect sensor or multi-terminal devices. Preferably, said semiconductor device is a multi-terminal device. Multi-terminal devices can be logic devices as integrated circuits and microprocessors or memory devices as random access memory (RAM), read only memory (ROM) and phase change random access memory (PCRAM). Preferably said semiconductor device is a multi-terminal logic device. In particular said semiconductor device is an integrated circuit or microprocessor.

Preferred embodiments are explained in the claims and the specification. It is understood that combinations of preferred embodiments are within the scope of the present invention.

A semiconductor device can be manufactured by the process of the invention. Said process preferably comprises the chemical mechanical polishing of a substrate or layer—preferably a layer—containing one or more III-V materials in the presence of the CMP composition as defined hereinabove or hereinbelow.

If the III-V material has the shape of a layer, the content of all III-V material contained in the layer is preferably more than 90%, more preferably more than 95%, most preferably more than 98%, particularly more than 99%, for example more than 99.9% by weight of the corresponding layer. A III-V material is a material consisting of at least one group 13 element (including Al, Ga, In) and at least one group 15 element (including N, P, As, Sb). The terms "group 13" and "group 15" refer to the current IUPAC convention for naming the groups in the periodic table of chemical elements. Preferably, said III-V material is GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, or GaInAsSb. More preferably, said III-V material is GaN, GaP, GaAs, GaSb, InP, InAs, InSb, InGaAs, or InAlAs. Most preferably, said III-V material is GaN, GaP, GaAs, GaAs, InP, or InAs. Particularly, said III-V material is GaAs (gallium arsenide) and/or InP (indium phosphide).

In the present invention a CMP composition as defined hereinabove and hereinbelow is used for chemical-mechanical polishing of a substrate or layer—preferably a layer—containing one or more III-V materials, preferably for chemical-mechanical polishing of a layer containing one or more III-V materials. If the III-V material has the shape of a layer, the content of all III-V material contained in the layer is preferably more than 90%, more preferably more than 95%, most preferably more than 98%, particularly more than 99%, for example more than 99.9% by weight of the corresponding layer. Preferably, said III-V material is GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, or GaInAsSb. More preferably, said III-V material is GaN, GaP, GaAs, GaSb, InP, InAs, InSb, InGaAs, or InAlAs. Most preferably, said III-V material is GaN, GaP, GaAs, GaAs, InP, or InAs. Particularly, said III-V material is GaAs (gallium arsenide) and/or InP (indium phosphide).

The CMP composition used according to the present invention comprises the components (A), (B), and (C) water and optionally further component (D) as described below.

Component (A): surface modified silica particles having a negative zeta potential of −15 mV or below at a pH in the range of from 2 to 6

The surface-modified silica particles have a zeta potential more negative than −15 mV, preferably, more negative than −25 mV, and most preferably more negative than −30 mV.

The surface modified silica particles are silica particles, preferably colloidal silica particles which are stabilized as the result of changes of the surface of the particles. The surface-modified silica particles are preferably amorphous and not agglomerated and thus typically occur in the form of discrete spheres that are not crosslinked with each other and contain hydroxyl groups on the surface. Colloidal silica particles are obtainable by methods known in the art such as ion-exchange of silicic acid salt, or by sol-gel technique (e.g., hydrolysis or condensation of a metal alkoxide, or peptization of precipitated hydrated silicon oxide, etc.).

Preferably the surface modified silica particles of component (A) having a negative zeta potential of −15 mV or below at a pH in the range of from 2 to 6 are silica particles anionically modified with metallate ions or modified with sulfonic acid.

Sulfonic acid-modified aqueous anionic silica sols which are highly stable under acidic conditions are disclosed e.g. in WO 2010/134542 A1. Herein, a sulfonic acid-modified aqueous anionic silica sol is obtained by a method wherein a silane coupling agent having a functional group which can be chemically converted into a sulfonic acid group is added to colloidal silica, and then the func-tional group is converted into a sulfonic acid group.

The term "anionically modified with metallate ions" as utilized herein in particular refers to silica particles where metallate ions (i.e., $M(OH)_4$—) are incorporated in the surface of the silica particle replacing $Si(OH)_4$ sites and creating a permanent negative charge, as explained in WO 2006/028759 A2.

Preferably the surface modified silica particles of component (A) having a negative zeta potential of −15 mV or below at a pH in the range of from 2 to 6 are silica particles anionically modified with metallate ions selected from the group consisting of aluminate, stannate, zincate, and plumbate. Most preferably the surface modified silica particles of component (A) having a negative zeta potential of −15 mV or below at a pH in the range of from 2 to 6 are silica particles anionically modified with aluminate. Such surface modified silica particles are disclosed e.g. in WO 2006/7028759 A2.

Generally, the particles (A) can be contained in varying amounts in the CMP composition used according to the present invention. Preferably, the amount of (A) is not more than 30 wt. % (wt. % in each case stands for "percent by weight"), more preferably not more than 5 wt. %, most preferably not more than 3 wt. %, particularly preferably not more than 2.5 wt. %, for example not more than 1.5 wt. %, in each case based on the total weight of the composition used according to the present invention. Preferably, the amount of (A) is at least 0.1 wt. %, particularly at least 0.4 wt. %, for example 1 wt. %, in each case based on the total weight of the composition used according to the present invention.

Generally, the particles (A) can be contained in varying particle size distributions. The particle size distributions of the particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The average particle size of the surface-modified silica is preferably in the range of from 1 to 200 nm, preferably of from 5 to 140 nm, and most preferably of from 10 to 100 nm. The term "particle size" as utilized herein refers to the average diameter of particles as measured by standard particle sizing instruments and methods, such as dynamic light scattering techniques, laser diffusion diffraction techniques, ultracentrifuge analysis techniques, etc. If not indicated otherwise dynamic light scattering techniques are preferred.

The BET surface determined according to DIN ISO 9277 of the silica particles can vary within a wide range. Preferably, the BET surface of the silica particles is in the range of from 1 to 500 $m^2/g$, more preferably in the range of from 5 to 350 $m^2/g$, most preferably in the range of from 10 to 300 $m^2/g$, in particular in the range of from 50 to 250 $m^2/g$, for example in the range of from 100 to 220 $m^2/g$.

Component (B):

As component (B), the CMP composition used according to the present invention contains one or more constituents selected from the group consisting of (i) substituted and unsubstituted triazoles not having an aromatic ring annealed to the triazol ring,
(ii) benzimidazole,
(iii) chelating agents selected from the group consisting of amino acids with two or more carboxy) groups, aliphatic carboxylic acids, and the respective salts thereof, and
(iv) homopolymers and copolymers of acrylic acid, and the respective salts thereof.

Preferably, the one or at least one of the substituted and unsubstituted triazoles of component (B) not having an aromatic ring annealed to the triazol ring is selected from the group consisting of 1,2,3-triazole, substituted 1,2,3-triazole, 1,2,4-triazole, and substituted 1,2,4-triazole. More preferably at least one of said (i) triazoles of component (B) not having an aromatic ring annealed to the triazol ring is a 1,2,3-triazole or a 1,2,4-triazole having one or two or more substituents wherein the one substituent or at least one of the two or more substituents is selected from the group consisting of

- substituted and unsubstituted, branched or unbranched alkyl, preferably C1 to C6 alkyl, for example methyl
- unsubstituted and substituted aryl, preferably phenyl, for example methylphenyl
- unsubstituted and N-substituted amino, preferably $N(R)_2$with R: H, C1 to C4 alkyl, for example NH2
- halogen, preferably Cl, Br, for example Cl
- cyano,
- substituted and unsubstituted, branched or unbranched alkoxy, preferably C1 to C6 alkoxy, for example C2 alkoxy
- carboxyl,
- carboxylate,
- substituted and unsubstituted vinyl,
- substituted and unsubstituted allyl.

Further preferably, at least one of the substituted and unsubstituted triazoles of component (B) not having an aromatic ring annealed to the triazol ring is a 1,2,3-triazole substituted in position 1 and/or 4 or a 1,2,4-triazole substituted in position 1 and/or 3.

Most preferably at least one of the substituted and unsubstituted triazoles of component (B) not having an aromatic ring annealed to the triazol ring is selected from the group consisting of 1,2,4-triazole and 3-amino-1,2,4-triazole.

Preferably at least one of said (iii) chelating agents selected from the group consisting of amino acids with two or more carboxyl groups, aliphatic carboxylic acids, and the respective salts thereof is selected from the group consisting of

- acetic acid, and the respective salts thereof,
- propionic acid, and the respective salts thereof,
- glycolic acid, and the respective salts thereof,
- aliphatic carboxylic acids with two or more carboxyl groups, selected from the group consisting of citric acid, malonic acid, oxalic acid, succinic acid, lactic acid, tartaric acid, adipic acid, pimelic acid, suberic acid, azelaic acid, sebacic acid, maleic acid, fumaric acid, other aliphatic carboxylic acids with two or more carboxyl groups, and the respective salts thereof,
- polyamino acetic acids, polyamino propionic acids, other polyamino carboxylic acids, and the respective salts thereof.

Most preferred chelating agents are selected from the group consisting of glycolic acid, citric acid, malonic acid, oxalic acid, succinic acid, nitrilotriacetic acid (NTA-H3), and the respective salts thereof.

Preferably at least one of said (iv) homopolymers and copolymers of acrylic acid and the respective salts thereof is selected from the group of homopolymers of acrylic acid and the respective salts thereof.

Generally, the constituents of component (B) can be contained in varying amounts in the CMP composition of the present invention.

Preferably, the total amount of (i) triazoles not having an aromatic ring annealed to the triazol ring is not more than 3 wt. % (wt. % in each case stands for "percent by weight"), more preferably not more than 2 wt. %, most preferably not more than 1 wt. %, particularly preferably not more than 0.5 wt. %, in each case based on the total weight of the composition used according to present invention. Preferably, the total amount of (i) triazoles not having an aromatic ring annealed to the triazol ring is at least 0.01 wt. %, particularly at least 0.05 wt. %, for example 0.1 wt. %, in each case based on the total weight of the composition used according to the present invention, and/or the total amount of (ii) benzimidazole is not more than 3 wt. % (wt. % in each case stands for "percent by weight"), more preferably not more than 2 wt. %, most preferably not more than 1 wt. %, particularly preferably not more than 0.5 wt. %, in each case based on the total weight of the composition used according to the present invention. Preferably, the total amount of (ii) benzimidazole is at least 0.01 wt. %, particularly at least 0.05 wt. %, for example 0.1 wt. %, in each case based on the total weight of the composition used according to the present invention, and/or the total amount of (iii) chelating agents selected from the group consisting of amino acids with two or more carboxyl groups, aliphatic carboxylic acids, and the respective salts thereof is not more than 3 wt. % (wt. % in each case stands for "percent by weight"), more preferably not more than 2 wt. %, most preferably not more than 1 wt. %, particularly preferably not more than 0.5 wt. %, in each case based on the total weight of the composition used according to the present invention. Preferably, the total amount of (iii) chelating agents selected from the group consisting of amino acids with two or more carboxyl groups, aliphatic carboxylic acids, and the respective salts thereof is at least 0.01 wt. %, particularly at least 0.05 wt. %, for example 0.1 wt. %, in each case based on the total weight of the composition used according to the present invention, and/or the total amount of (iv) homopolymers and copolymers of acrylic acid, and the respective salts thereof is not more than 3 wt. % (wt. % in each case stands for “percent by weight”), more preferably not more than 2 wt. %, most preferably not more than 1 wt. %, particularly preferably not more than 0.5 wt. %, in each case based on the total weight of the composition used according to the present invention. Preferably, the total amount of (iv) homopolymers and copolymers of acrylic acid, and the respective salts thereof is at least 0.01 wt. %, particularly at least 0.05 wt. %, for example 0.1 wt. %, in each case based on the total weight of the composition used according to the present invention.

Preferably, the chemical-mechanical polishing (CMP) composition used according to the present invention does not comprise simultaneously compounds of three or all four of the groups (i) to (iv) identified above as potential constituents of component (B), i.e. preferred chemical-mechanical polishing (CMP) compositions used according to the present invention do not comprise simultaneously compounds of three or all four of the following groups:

(i) substituted and unsubstituted triazoles not having an aromatic ring annealed to the triazol ring,
(ii) benzimidazole,
(iii) chelating agents selected from the group consisting of amino acids with two or more carboxy) groups, aliphatic carboxylic acids, and the respective salts thereof, and
(iv) homopolymers and copolymers of acrylic acid, and the respective salts thereof, More preferably, chemical-mechanical polishing (CMP) compositions used according to the present invention do not comprise simultaneously compounds of two or more of said groups.

Preferably, the total amount all constituents of component (B) is not more than 3 wt. % (wt. % in each case stands for “percent by weight”), more preferably not more than 2 wt. %, most preferably not more than 1 wt. %, particularly preferably not more than 0.5 wt. %, in each case based on the total weight of the composition of the present invention. Preferably, the total amount of component (B) is at least 0.01 wt. %, particularly at least 0.05 wt. %, for example 0.1 wt. %, in each case based on the total weight of the composition of the present invention.

Optional further constituents (D):

A CMP composition used according to the present invention may comprise further constituents, depending on the specific requirements of the intended use of said CMP composition. Preferably the one or at least one of or all of the further constituents of component (D) are selected from the group consisting of oxidizing agents, abrasive materials different from surface modified silica particles having a negative zeta potential of −15 mV or below at a pH in the range of from 2 to 6, stabilizers, surfactants, friction reducing agents, buffer substances.

The CMP composition used according to the present invention can further optionally comprise one or more types of oxidizing agent (D1), preferably one to two types of oxidizing agent (D1), more preferably one type of oxidizing agent (D1). The oxidizing agent (D1) is different from the components (A), (B) and (C) water. In general, the oxidizing agent is a compound which is capable of oxidizing the to-be-polished substrate or one of its layers. Preferably, (D1) is a per-type oxidizer. More preferably, (D1) is a peroxide, persulfate, perchlorate, perbromate, periodate, permanganate, or a derivative thereof. Most preferably, (D1) is a peroxide or persulfate. Particularly, (D1) is a peroxide. For example, (D1) is hydrogen peroxide.

If present, the oxidizing agent (D1) can be contained in varying amounts in the CMP composition used according to the present invention. Preferably, the amount of (D1) is not more than 20 wt. % (wt. % in each case stands for “percent by weight”), more preferably not more than 10 wt. %, most preferably not more than 5 wt. %, particularly not more than 3.5 wt. %, for example not more than 2.7 wt. %, in each case based on the total weight of the CMP composition used according to the present invention. Preferably, the amount of (D1) is at least 0.01 wt. %, more preferably at least 0.08 wt. %, most preferably at least 0.4 wt. %, particularly at least 0.75 wt. %, for example at least 1 wt. %, in each case based on the total weight of the composition used according to the present invention. If hydrogen peroxide is used as oxidizing agent (D1), the amount of (D1) is preferably 1 wt. % to 5 wt. %, more preferably 2 wt. % to 3.5 wt. %, for instance 2.5 wt. %, in each case based on the total weight of the CMP composition used according to the present invention.

The CMP composition used according to the present invention can further optionally contain one or more biocides (D2), for example one biocide. The biocide (D2) is different from the components (A), (B), (C) and from constituent (D1) of component (D). In general, the biocide is a compound which deters, renders harmless, or exerts a controlling effect on any harmful organism by chemical or biological means. Preferably, (D2) is an quaternary ammonium compound, an isothiazolinone-based compound, an N-substituted diazenium dioxide, or an N'-hydroxy-diazenium oxide salt. More preferably, (D2) is an N-substituted diazenium dioxide, or an N'-hydroxy-diazenium oxide salt.

If present, the biocide (D2) can be contained in varying amounts in the CMP composition used according to the present invention. If present, the amount of (D2) is preferably not more than 0.5 wt. % (wt. % in each case stands for “percent by weight”), more preferably not more than 0.1 wt. %, most preferably not more than 0.05 wt. %, particularly not more than 0.02 wt. %, for example not more than 0.008 wt. %, in each case based on the total weight of the corresponding CMP composition used according to the present invention. If present, the amount of (D2) is preferably at least 0.0001 wt. %, more preferably at least 0.0005 wt. %, most preferably at least 0.001 wt. %, particularly at least 0.003 wt. %, for example at least 0.006 wt. %, in each case based on the total weight of the corresponding CMP composition used according to the present invention.

The properties of the CMP composition used according to the present invention, such as stability and polishing performance, may depend on the pH of the corresponding composition. The pH value of the CMP composition used according to the present invention is in the range of from 2 to 6 preferably from 2.2 to 6, more preferably from 2.5 to 5.8, further preferably from 2.5 to 5.5, still further preferably from 2.8 to 5.5, especially preferably from 3 to 5.2, particularly preferably from 3 to 5, more particular preferably from 3.2 to 5, particularly from 3.5 to 4.5, for example 4.

The CMP composition used according to the present invention can further optionally contain one or more buffer substances (D3). The buffer substance (D3) is different from the components (A), (B), (C) and from constituents (D1) and (D2) of component (D). In general, the buffer substance (D3) is a compound which is added to the CMP composition used according to the present invention to have its pH value adjusted to the required value. Preferred buffer substances are inorganic acids, carboxylic acids, amine bases, alkali hydroxides, ammonium hydroxides, including tetraalkylammonium hydroxides. For example, the buffer substance (D3) is nitric acid, sulfuric acid, ammonia, sodium hydroxide, or potassium hydroxide.

If present, the buffer substance (D3) can be contained in varying amounts in the CMP composition used according to the present invention. If present, the amount of (D3) is preferably not more than 10 wt. % (wt. % in each case stands for "percent by weight"), more preferably not more than 2 wt. %, most preferably not more than 0.5 wt. %, particularly not more than 0.1 wt. %, for example not more than 0.05 wt. %, in each case based on the total weight of the corresponding composition. If present, the amount of (D3) is preferably at least 0.0005 wt. %, more preferably at least 0.005 wt. %, most preferably at least 0.025 wt. %, particularly at least 0.1 wt. %, for example at least 0.4 wt. %, in each case based on the total weight of the CMP composition used according to the present invention).

The CMP composition used according to the present invention may also contain, if necessary, one or more other additives, including but not limited to stabilizers, surfactants, friction reducing agents, etc. Said other additives is different from the components (A) (B), (C), and from constituents (D1), (D2) and (D3) of component (D). Said other additives are for instance those commonly employed in CMP compositions and thus known to the person skilled in the art. Such addition can for example stabilize the dispersion, or improve the polishing performance, or the selectivity between different layers.

If present, said other additive can be contained in varying amounts in the CMP composition used according to the present invention. Preferably, the total amount of said other additives is not more than 10 wt. % (wt. % in each case stands for "percent by weight"), more preferably not more than 2 wt. %, most preferably not more than 0.5 wt. %, particularly not more than 0.1 wt. %, for example not more than 0.01 wt. %, in each case based on the total weight of the corresponding CMP composition. Preferably, the total amount of said other additives is at least 0.0001 wt. %, more preferably at least 0.001 wt. %, most preferably at least 0.008 wt. %, particularly at least 0.05 wt. %, for example at least 0.3 wt. %, in each case based on the total weight of the corresponding CMP composition used according to the present invention.

Preferably, the chemical-mechanical polishing (CMP) composition does not comprise any abrasive materials different from above-defined surface modified silica particles having a negative zeta potential of −15 mV or below at a pH in the range of from 2 to 6.

Particularly preferred is the use of a chemical-mechanical polishing (CMP) composition wherein the surface modified silica particles of component (A) having a negative zeta potential of −15 mV or below at a pH in the range of from 2 to 6 are silica particles anionically modified with aluminate or modified with sulfonic acid, and component (B) comprises one or more constituents selected from the group consisting of substituted and unsubstituted triazoles selected from the group consisting of 1,2,4-triazole and 3-amino-1,2,4-triazole benzimidazole chelating agents selected from the group consisting of glycolic acid, citric acid, malonic acid, oxalic acid, succinic acid, nitrilotriacetic acid (NTA-H3), and the respective salts thereof and homopolymers of acrylic acid.

Particularly preferred is the use of a chemical-mechanical polishing (CMP) composition wherein the total amount of (A) surface modified silica particles having a negative zeta potential of −15 mV or below at a pH in the range of from 2 to 6 is in the range of from 0.1 wt.-% to 30 wt.-%, based on the total weight of the chemical-mechanical polishing (CMP) composition.

and/or the total amount of triazoles not having an aromatic ring annealed to the triazol ring is in the range of from 0.01 to 3.0 wt.-%, based on the total weight of the chemical-mechanical polishing (CMP) composition and/or the total amount of benzimidazole is in the range of from 0.01 to 3.0 wt.-%, based on the total weight of the chemical-mechanical polishing (CMP) composition and/or the total amount of chelating agents selected from the group consisting of amino acids with two or more carboxyl groups, aliphatic carboxylic acids, and the respective salts thereof is in the range of from 0.01 to 3.0 wt.-%, based on the total weight of the chemical-mechanical polishing (CMP) composition and/or the total amount of homopolymers and copolymers of acrylic acid, and the respective salts thereof is in the range of from 0.01 to 3.0 wt.-%, based on the total weight of the chemical-mechanical polishing (CMP) composition.

It is understood that the above-defined preferred CMP compositions used according to the present invention have a pH of from 2 to 6 as described above.

Processes for preparing CMP compositions are generally known. These processes may be applied to the preparation of the CMP composition used according to the present invention. This can be carried out by dispersing or dissolving the above-described components (A) and (B), and if appropriate the optional further constituents of component (D) in water, and optionally by adjusting the pH value through adding a buffer substance (D3) as defined hereinabove or hereinbelow. For this purpose the customary and standard mixing processes and mixing apparatuses such as agitated vessels, high shear impellers, ultrasonic mixers, homogenizer nozzles or counterflow mixers, can be used.

The CMP composition used according to the present invention is preferably prepared by dispersing the particles (A), dispersing and/or dissolving component (B) and optionally dispersing and/or dissolving the further constituents (D) in water (C).

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process used according to the invention, the CMP composition used according to the present invention is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

For further details reference is made to WO 2004/063301 A1, in particular page 16, paragraph [0036] to page 18, paragraph [0040] in conjunction with the FIG. 2.

By way of the CMP process of the invention, wafers with integrated circuits comprising a dielectric layer can be obtained which have an excellent functionality, especially when the substrate or layer to be polished contains one or more III-V materials.

The CMP composition used according to the present invention can be used in the CMP process as ready-to-use slurry, they have a long shelf-life and show a stable particle size distribution over long time. Thus, they are easy to handle and to store. They show an excellent polishing performance, particularly with regard to adjustable selectivity and high surface quality combined with minimal generation of the toxic gasses $AsH_3$ and $PH_3$. Since the amounts of its components are held down to a minimum, the CMP composition used according to the present invention and the CMP process according to the invention can be used or applied in a cost-effective way.

EXAMPLES AND COMPARATIVE EXAMPLES

General Procedure for the CMP Experiments

For the evaluation on benchtop polisher, the following parameters were chosen:

Procedure setting: Phoenix 4000 polisher; table/carrier 200/150 rpm; down force 2.5 psi (17238 Pa); slurry flow rate 18 mL/min; pad IC 1000; time 1 min.

The pad is conditioned by several sweeps, before a new type of CMP composition is used for CMP. For the determination of removal rates at least 3 wafers are polished and the data obtained from these experiments are averaged.

The CMP composition is stirred in the local supply station.

Object to be polished: unstructured GaAs wafers and unstructured InP wafers.

The GaAs material removal rates (referred to as "GaAs-MRR" in the following) for 2 inch (=5.08 cm) discs polished by the CMP composition are determined by difference of weight of the coated wafers or blanket discs before and after CMP, using a Sartorius LA310 S scale. The difference of weight can be converted into the difference of film thickness since the density (5.32 g/cm$^3$ for GaAs) and the surface area of the polished material are known. Dividing the difference of film thickness by the polishing time provides the values of the material removal rate. The InP material removal rates (referred to as "InP-M RR" in the following) were determined in the same manner.

The surface quality of GaAs layers and InP layers was measured by root mean square roughness (RMS) on polished substrates with Atomic Force Microscopy (AFM) (Dimension FastScan, Bruker) with scan area 5 μm×5 μm using Tapping Mode™ (=intermittent contact mode) as scanning mode.

Standard Procedure for Slurry Preparation:

The components (A), (B) and (D1)—each in the amounts as indicated in tables 1-6—were dispersed or dissolved in de-ionized water. pH is adjusted by adding of aqueous 10% KOH solution or $HNO_3$ (0.1%-10%) solution to the slurry. The pH value is measured with a pH electrode (Schott, blue line, pH 0-14/−5 . . . 100° C./3 mol/L sodium chloride).

Measurement of the Zeta Potential

For measuring electrophoretic mobility and zeta potential of the silica particles (A) a standard Zetasizer Nano device from the company Malvern was used. The samples were diluted by a factor of 500 with 10 mmol/l KCl solution before measuring the mobility. The measurements were done at 23° C.

Examples 1 to 14 and Comparative Examples 1-15

In comparative examples 1 to 8 and 12 and in examples 1 to 14 according to the invention, the particles (A) are aluminate-modified anionic colloidal silica having a typical particle size of 15 nm, a typical surface area of 200 m$^2$/g and a zeta potential of −40 mV at pH 4, e.g. Levasil® 200A (from Akzo Nobel).

In comparative example 9, the particles (A) are acidic colloidal silica having a typical particle size of 85 nm, a typical surface area of 35 m$^2$/g and a zeta potential of −8 mV at pH =4, e.g. NexSil™ 125A.

In comparative examples 10 and 13 to 15, the particles (A) are potassium-stabilized colloidal silica particles having a typical particle size of 85 nm, a typical surface area of 35 m$^2$/g and a zeta potential of −10 mV at pH=4, e.g. NexSil™ 125K.

In comparative example 11, the silica particles (A) are cocoon-shaped colloidal silica particles having an average primary particle size (d1) of 35 nm and an average secondary particle size (d2) of 70 nm. and a zeta potential of +2 mV at pH=4, e.g. Fuso PL3 (from FUSO Chemical Co Ltd).

In examples 1 and 2 according to the invention, the additive (B) is 1,2,4-triazole.

In examples 3 to 5 according to the invention, the additive (B) is 3-amino-1,2,4-triazole.

In examples 6 and 7 according to the invention, the additive (B) is benzimidazole.

In comparative example 2, the additive (B) is benzotriazole.

In comparative example 3, the additive (B) is tolyltriazole.

In comparative examples 4-8, the additives (B) are commercially available corrosion inhibitors from BASF SE.

In example 8 according to the invention, the additive (B) is citric acid.

In example 9 according to the invention, the additive (B) is malonic acid.

In example 10 according to the invention, the additive (B) is oxalic acid.

In comparative example 14 and example 11 according to the invention, the additive (B) is nitrilotriacetic acid, e.g. Trilon® AS (BASF SE).

In comparative example 15 and example 12 according to the invention, the additive (B) is a polyacrylic acid having a weight average molar mass Mw of 100000 g/mol .e.g. Sokalan® PA 80 S from BASF SE.

In example 13 according to the invention, the additive (B) is glycolic acid.

In example 14 according to the invention, the additive (B) is succinic acid.

In comparative example 12, the additive (B) glycine.

Aqueous dispersions containing the components (A), (B) and (D1) as listed in tables 1 and 2 were prepared, and the polishing performance data compiled in tables 1 and 2 were determined.

In table 1, the effect of the zeta potential of the silica partices (A) on the polishing results is shown. With those types of silica (NexSil 125K , Nexsil 125 A %, Fuso PL 3) having a zeta potential less negative than −15 mV the material removal rate of InP is decreased.

TABLE 1

| | Comparative example 1 | Comparative example 9 | Comparative example 10 | Comparative example 11 |
|---|---|---|---|---|
| Particles (A) | Levasil 200A 3.0 wt. % | NexSil 125A 3.0 wt. % | NexSil 125K 3.0 wt. % | Fuso PL 3 3.0 wt. % |
| Additive (B) | none | none | none | none |
| Oxidizing agent (D1) | $H_2O_2$ 1.5 wt. % | $H_2O_2$ 1.5 wt. % | $H_2O_2$ 1.5 wt. % | $H_2O_2$ 1.5 wt. % |
| pH | 4 | 4 | 4 | 4 |
| GaAs MRR* (Å/min) | 2149 | 2423 | 2440 | 1949 |
| InP MRR (Å/min) | 2551 | 1324 | 1487 | 515 |
| RMS on GaAs (nm) | >3 | >3 | >3 | >3 |

TABLE 1-continued

| | Comparative example 1 | Comparative example 9 | Comparative example 10 | Comparative example 11 |
|---|---|---|---|---|
| RMS on InP (nm) | <0.5 | <0.5 | <0.5 | <0.5 |

In the further examples, several combinations of silica particles (A) and additives (B) were tested.

Tables 2 and 3 show that—compared to comparative examples 1-3 comprising no additive (B) or benzotriazole (BTA see also WO 2006/028759) or tolyltriazole—additives (B) selected from the group consisting of substituted and unsubstituted triazoles not having an aromatic ring annealed to the triazol ring provide increased material removal rate M RR of both GaAs and InP. Moreover, a significant improvement in surface finish, especially on GaAs is observed. All compositions, including comparative example 1, show RMS less than 0.5 nm on InP substrates after polishing. Increasing concentration of each of the additives (B) 1,2,4-triazole, 3-amino-1,2,4-triazole and benzimidazole results in an increase of the GaAs removal while the InP removal rate dropped slightly. At higher additive concentration, lower RMS on polished substrates are measured. In contrast, the comparative examples 2 and 3 show that triazoles having an aromatic ring annealed to the triazol ring, (benzotriazole, tolyltriazole) which are of more hydrophobic nature, strongly reduce the removal rate of both GaAs and InP and are leading to a degradation in surface finish.

TABLE 2

| | Comparative example 1 | Comparative example 2 | Comparative example 3 |
|---|---|---|---|
| Particles (A) (aluminate-modified silica) | 3.0 wt. % | 3.0 wt. % | 3.0 wt. % |
| Additive (B) | none | Benzotriazole, 0.1 wt. % | Tolyltriazol 0.1 wt. % |
| Oxidizing agent (D1) | $H_2O_2$ 1.5 wt. % | $H_2O_2$ 1.5 wt. % | $H_2O_2$ 1.5 wt. % |
| pH | 4 | 4 | 4 |
| GaAs MRR* (Å/min) | 2149 | 914 | 1511 |
| InP MRR (Å/min) | 2551 | 312 | 1118 |
| RMS on GaAs (nm) | >3 | >3 | >3 |
| RMS on InP (nm) | <0.5 | <0.5 | <0.5 |

TABLE 3

| . . . | Example 01 | Example 02 | Example 03 | Example 04 | Example 05 | Example 06 | Example 07 |
|---|---|---|---|---|---|---|---|
| Particles (A) (aluminate-modified silica) | 3.0 wt. % | 3.0 wt. % | 3.0 wt. % | 3.0 wt. % | 3.0 wt. % | 3.0 wt. % | 3.0 wt. % |
| Additive (B) | 1,2,4-triazole, 0.1 wt. % | 1,2,4-triazole, 0.5 wt. % | 3-amino-1,2,4-triazole, 0.1 wt. % | 3-amino-1,2,4-triazole, 0.2 wt. % | 3-amino-1,2,4-triazole, 0.5 wt. % | Benz-imidazole, 0.1 wt. % | Benz-imidazole, 0.2 wt. % |
| Oxidizing agent (D1) | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % |
| pH | 4 | 4 | 4 | 4 | 4 | 4 | 4 |
| GaAs MRR* (Å/min) | 2458 | 3094 | 2629 | 2913 | 3227 | 3122 | 2907 |
| InP MRR (Å/min) | 4006 | 3729 | 3113 | 2937 | 2159 | 2865 | 2953 |
| RMS on GaAs (nm) | 2.5 | 1.6 | 1.9 | 1.3 | 0.8 | 1.5 | 0.8 |
| RMS on InP (nm) | <0.5 | <0.5 | <0.5 | <0.5 | <0.5 | <0.5 | <0.5 |

Further comparative examples were carried out with commercially available N containing or COO— containing corrosion inhibitors, see table 4. In all cases a removal rate suppression either on GaAs or InP is observed, and rough surface finish on GaAs is obtained.

TABLE 4

| | Comparative example 4 | Comparative example 5 | Comparative example 6 | Comparative example 7 | Comparative example 8 |
|---|---|---|---|---|---|
| Particles (A) (aluminate-modified silica) | 3.0 wt. % | 3.0 wt. % | 3.0 wt. % | 3.0 wt. % | 3.0 wt. % |
| Additive (B) | Korantin PM, 0.1 wt. % | Korantin MAT, 0.1 wt. % | Korantin SMK, 0.1 wt. % | Korantin LUB, 0.1 wt. % | Korantin PAT, 0.1 wt. % |
| Oxidizing agent (D) | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % |
| pH | 4 | 4 | 4 | 4 | 4 |
| GaAs MRR* (Å/min) | 1676 | 1787 | 1467 | 362 | 1105 |
| InP MRR (Å/min) | 3026 | 3963 | 510 | 206 | 933 |
| RMS on GaAs (nm) | >3 | >3 | >3 | >3 | >3 |
| RMS on InP (nm) | <0.5 | <0.5 | <0.5 | <0.5 | <0.5 |

When chelating agents selected from the group consisting of amino acids with two or more carboxyl groups, aliphatic carboxylic acids, and the respective salts thereof are used as additive (B), a strong suppression of InP removal is observed, and the selectivity (ratio MRR(GaAs)/MRR(InP)) was increased accordingly. The highest ratio MRR(GaAs)/MRR(InP) of 121 was achieved with addition of 0.1 wt % citric acid.

TABLE 5

| | Comparative example 1 | Example 8 | Example 9 | Example 10 | Example 11 | Example 12 | Example 13 | Example 14 | Comparative example 12 |
|---|---|---|---|---|---|---|---|---|---|
| Particles (A) (aluminate-modified silica) | 3.0 wt. % | 3.0 wt. % | 3.0 wt. % | 3.0 wt. % | 3.0 wt. % | 3.0 wt. % | 3.0 wt. % | 3.0 wt. % | 3.0 wt. % |
| Additive 01 (B) | | Citric acide, 0.1 wt. % | Malonic acid, 0.1 wt. % | Oxalic acide, 0.1 wt. % | Nitrilo-triacetic acid 0.1 wt. % | Poly-acrylic acid Mw = 100000 g/mol 0.1 wt. %. | Glycolic acide, 0.1 wt. % | Succinic acid, 0.1 wt. % | Glycine, 0.1 wt. % |
| Oxidizing agent (D1) | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % |
| pH | 4 | 4 | 4 | 4 | 4 | 4 | 4 | 4 | 4 |
| GaAs MRR* (Å/min) | 2149 | 1815 | 1935 | 2177 | 2253 | 2451 | 2472 | 3277 | 2147 |
| InP MRR (Å/min) | 2551 | 15 | 64 | 90 | 142 | 93 | 1551 | 1075 | 3308 |
| MRR(GaAs)/MRR(InP) | 0.9 | 121 | 30.2 | 24.2 | 15.7 | 26.4 | 1.6 | 3 | 0.6 |

This effect is unique to the combination of the surface-modified silica particles (A) having a negative zeta potential of −15 mV or below at a pH in the range of from 2 to 6 with a chelating agents selected from the group consisting of amino acids with two or more carboxyl groups, aliphatic carboxylic acids, and the respective salts thereof, as can be seen from comparison examples 13 to 15 (Table 6) which correspond to comparison example 1 and examples 11 and 12 according to the invention with the exception that potassium-stabilized colloidal silica is used as particles (A) instead of aluminate-modified silica. With potassium-stabilized colloidal silica, the presence of additive (B) in each case results in a suppression of the material removal rates for GaAs, resulting in a reduced selectivity MRR(GaAs)/MRR(InP)

TABLE 6

| | Comparative example 13 | Comparative example 14 | Comparative example 15 |
|---|---|---|---|
| Particles (A) (potassium-stabilized colloidal silica) | 3.0 wt. % | 3.0 wt. % | 3.0 wt. % |

TABLE 6-continued

| | Comparative example 13 | Comparative example 14 | Comparative example 15 |
|---|---|---|---|
| Additive (B) | none | nitrilotriacetic acid 0.1 wt. % | polyacrylic acid Mw = 100000 g/mol 0.1 wt. %. |
| Oxidizing agent (D1) | $H_2O_2$ 1.5 wt. % | $H_2O_2$ 1.5 wt. % | $H_2O_2$ 1.5 wt. % |
| pH | 4 | 4 | 4 |

TABLE 6-continued

| | Comparative example 13 | Comparative example 14 | Comparative example 15 |
|---|---|---|---|
| GaAs MRR* (Å/min) | 2440 | 1813 | 2373 |
| InP MRR (Å/min) | 1487 | 945 | 276 |
| MRR(GaAs)/ MRR(InP) | 1.6 | 1.9 | 8.6 |

The invention claimed is:

1. A polishing method, comprising polishing the surface of a substrate or layer, wherein said surface comprises at least one III-V material, with a chemical mechanical polishing (CMP) composition, wherein the chemical-mechanical polishing (CMP) composition comprises:

(A) surface modified silica particles having a negative zeta potential of −15 mV or below at a pH in the range of from 2 to 6;

(B) at least one constituent selected from the group consisting of (i) substituted and unsubstituted triazoles not having an aromatic ring annealed to the triazole ring, (ii) benzimidazole in an amount of 0.2 to 3.0 wt % based on the total weight of the chemical mechanical polishing (CMP) composition, (iii) chelating agents selected from the group consisting of amino acids with two or more carboxyl groups, aliphatic carboxylic acids, and the respective salts thereof, and (iv) homopolymers and copolymers of acrylic acid, and the respective salts thereof;

(C) water; and (D) optionally at least one further constituent, wherein the pH of the composition is in the range of from 2 to 6.

2. The method according to claim 1, wherein the at least one III-V material is selected from the group consisting of GaN, GaP, GaAs, GaSb, AlAs, AlN, InP, InAs, InSb, InGaAs, InAlAs, AlGaAs, GaAlN, GaInN, InGaAlAs, InGaAsP, InGaP AlInP GaAlSb, GalnSb, GaAlAsSb, and GaInAsSb.

3. The method according to claim 1, wherein the surface modified silica particles of component (A) having a negative zeta potential of −15 mV or below at a pH in the range of from 2 to 6 are silica particles anionically modified with metallate ions or modified with sulfonic acid.

4. The method according claim 1, wherein the surface modified silica particles of component (A) having a negative zeta potential of −15 mV or below at a pH in the range of from 2 to 6 are silica particles anionically modified with metallate ions selected from the group consisting of aluminate, stannate, zincate, and plumbate.

5. The method according to claim 1, wherein the surface modified silica particles of component (A) having a negative zeta potential of −15 mV or below at a pH in the range of from 2 to 6 are silica particles anionically modified with aluminate.

6. The method according to claim 1, wherein the at least one of the substituted and unsubstituted triazoles of component (B) not having an aromatic ring annealed to the triazole ring is selected from the group consisting of 1,2,3-triazole, substituted 1,2,3-triazole, 1,2,4-triazole, and substituted 1,2,4-triazole.

7. The method according to claim 1, wherein at least one of the substituted and unsubstituted triazoles of component (B) not having an aromatic ring annealed to the triazole ring is a 1,2,3-triazole or a 1,2,4-triazole, the respective triazole having at least one substituent, wherein the at least one substituent is selected from the group consisting of substituted and unsubstituted, branched or unbranched alkyl, unsubstituted and substituted aryl, unsubstituted and N-substituted amino, halogen, cyano, substituted and unsubstituted, branched or unbranched alkoxy, carboxyl, carboxylate, substituted and unsubstituted vinyl, and substituted and unsubstituted allyl.

8. The method according to claim 1, wherein at least one of the substituted and unsubstituted triazoles of component (B) not having an aromatic ring annealed to the triazole ring is a 1,2,3-triazole substituted in position 1 and/or 4 or a 1,2,4-triazole substituted in position 1 and/or 3.

9. The method according to claim 1, wherein at least one of the substituted and unsubstituted triazoles of component (B) not having an aromatic ring annealed to the triazol ring is selected from the group consisting of 1,2,4-triazole and 3-amino- 1,2,4-triazole.

10. The method according to claim 1, wherein at least one of the chelating agents of component (B) selected from the group consisting of amino acids with two or more carboxyl groups, aliphatic carboxylic acids, and the respective salts thereof, is selected from the group consisting of acetic acid, and the respective salts thereof, propionic acid, and the respective salts thereof, glycolic acid, and the respective salts thereof, aliphatic carboxylic acids with two or more carboxyl groups, selected from the group consisting of citric acid, malonic acid, oxalic acid, succinic acid, lactic acid, tartaric acid, adipic acid, pimelic acid, suberic acid, azelaic acid, sebacic acid, maleic acid, fumaric acid, other aliphatic carboxylic acids with two or more carboxyl groups, and the respective salts thereof, polyamino acetic acids, polyamino propionic acids, other polyamino carboxylic acids, and the respective salts thereof.

11. The method according to claim 1, wherein the surface modified silica particles of component (A) having a negative zeta potential of −15 mV or below at a pH in the range of from 2 to 6 are silica particles anionically modified with aluminate or modified with sulfonic acid, component (B) comprises at least one constituent selected from the group consisting of substituted and unsubstituted triazoles selected from the group consisting of 1,2,4-triazole and 3-amino-1,2,4-triazole benzimidazole chelating agents selected from the group consisting of glycolic acid, citric acid, malonic acid, oxalic acid, succinic acid, nitrilotriacetic acid (NTA-H3), and the respective salts thereof and homopolymers of acrylic acid.

12. The method according to claim 1, wherein the total amount of (A) surface modified silica particles having a negative zeta potential of −15 mV or below at a pH in the range of from 2 to 6 is in the range of from 0.1 wt.-% to 30 wt.-%, based on the total weight of the chemical-mechanical polishing (CMP) composition and/or the total amount of triazoles not having an aromatic ring annealed to the triazol ring is in the range of from 0.01 to 3.0 wt.-%, based on the total weight of the chemical-mechanical polishing (CMP) composition and/or the total amount of benzimidazole is in the range of from 0.2 to 2.0 wt.-%, based on the total weight of the chemical-mechanical polishing (CMP) composition and/or the total amount of chelating agents selected from the group consisting of amino acids with two or more carboxyl groups, aliphatic carboxylic acids, and the respective salts thereof is in the range of from 0.01 to 3.0 wt.-%, based on the total weight of the chemical-mechanical polishing (CMP) composition and/or the total amount of homopolymers and copolymers of acrylic acid, and the respective salts thereof is in the range of from 0.01 to 3.0 wt.-%, based on the total weight of the chemical-mechanical polishing (CMP) composition.

13. The method according to claim 1, wherein the chemical-mechanical polishing (CMP) composition comprises at least one further constituent as component (D), wherein the at least one further constituent of component (D) is selected from the group consisting of oxidizing agents, abrasive materials different from surface modified silica particles having a negative zeta potential of −15 mV or below at a pH in the range of from 2 to 6, stabilizers, surfactants, friction reducing agents, and buffer substances.

* * * * *